United States Patent
Feinstein et al.

(10) Patent No.: US 9,046,684 B1
(45) Date of Patent: Jun. 2, 2015

(54) METHOD FOR SELECTIVELY TREATING SURFACES

(75) Inventors: Casey Feinstein, San Jose, CA (US);
Matthieu Liger, Seattle, WA (US);
Chia-Jean Wang, Palo Alto, CA (US)

(73) Assignee: Google Inc., Mountain View, CA (US)

(*) Notice: Subject to any disclaimer, the term of this patent is extended or adjusted under 35 U.S.C. 154(b) by 105 days.

(21) Appl. No.: 13/548,061

(22) Filed: Jul. 12, 2012

(51) Int. Cl.
| | |
|---|---|
| *G02B 1/10* | (2006.01) |
| *G02B 27/01* | (2006.01) |
| *G03F 7/00* | (2006.01) |
| *C03C 17/00* | (2006.01) |
| *C03C 15/00* | (2006.01) |

(52) U.S. Cl.
CPC .............. *G02B 27/01* (2013.01); *G02B 27/017* (2013.01); *G02B 1/10* (2013.01); *G02B 27/0172* (2013.01); *G03F 7/0002* (2013.01); *G03F 7/0005* (2013.01); *C03C 17/00* (2013.01); *C03C 15/00* (2013.01)

(58) Field of Classification Search
CPC .. G02B 27/01; G02B 27/017; G02B 27/0172; G02B 1/10; G03F 7/0002; G03F 7/0005; C03C 17/00; C03C 15/00
USPC .................. 156/291, 62.2; 174/260; 206/460; 209/155; 216/100; 228/246; 252/182.11, 299.01, 500; 257/40; 269/21; 359/296; 385/30; 423/594.9; 428/143, 194, 332, 344, 40.4, 403, 428/546; 435/174; 436/67; 438/253, 565, 438/684; 451/2; 510/139; 526/285
See application file for complete search history.

(56) References Cited

U.S. PATENT DOCUMENTS

| | | | |
|---|---|---|---|
| 5,453,405 A * | 9/1995 | Fan et al. ................... | 438/34 |
| 6,180,226 B1 * | 1/2001 | McArdle et al. .............. | 428/332 |
| 6,284,345 B1 * | 9/2001 | Ruoff ............................ | 428/143 |
| 7,586,686 B1 * | 9/2009 | Hall .............................. | 359/643 |
| 7,728,436 B2 | 6/2010 | Whelan et al. | |
| 8,070,931 B1 | 12/2011 | Cohen et al. | |
| 2003/0215638 A1 * | 11/2003 | Charnay et al. ............. | 428/403 |
| 2006/0047030 A1 * | 3/2006 | Yoshida et al. ................ | 524/99 |
| 2007/0111366 A1 * | 5/2007 | Odom et al. .................... | 438/71 |
| 2008/0239422 A1 * | 10/2008 | Noda .............................. | 359/13 |
| 2009/0170035 A1 | 7/2009 | Lee et al. | |
| 2009/0178751 A1 * | 7/2009 | Presley et al. .................. | 156/60 |
| 2009/0294692 A1 * | 12/2009 | Bourke et al. .............. | 250/459.1 |
| 2011/0232954 A1 | 9/2011 | Sirringhaus et al. | |
| 2011/0267697 A1 | 11/2011 | Kohli et al. | |

OTHER PUBLICATIONS

Profile Simulation and Fabrication of Gold Nanostructures by Separated Nanospheres with Oblique Deposition and Perpendicular Etching, Plasmonics (2007) 2 pp. 217-230.*

* cited by examiner

*Primary Examiner* — Duy Deo
*Assistant Examiner* — Erin Bergner
(74) *Attorney, Agent, or Firm* — Blakely Sokoloff Taylor & Zafman LLP

(57) ABSTRACT

A method of treating a surface includes providing an object and applying a masking layer to a target surface area of the object. A sacrificial material is applied to a non-target surface area of the object. The method also includes removing the masking layer from the target surface area. The target surface area is exposed to a substance that etches or coats the target surface area. The sacrificial material from the non-target surface area of the object is removed, leaving the target surface area of the object etched or coated by the substance while the non-target surface area is not etched or coated by the substance.

13 Claims, 5 Drawing Sheets

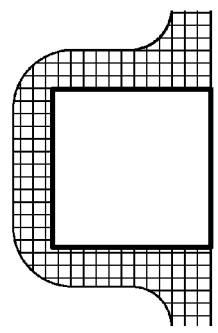
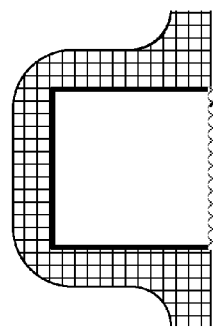
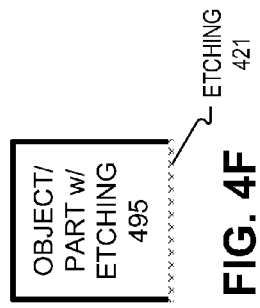
FIG. 4D
FIG. 4E
FIG. 4F
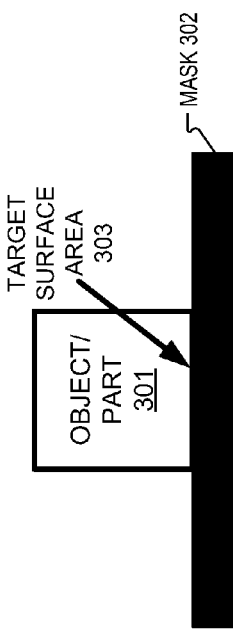
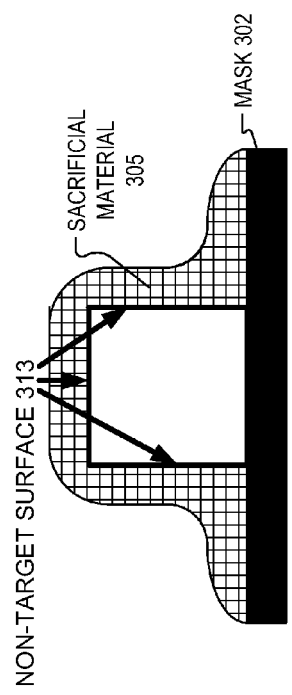
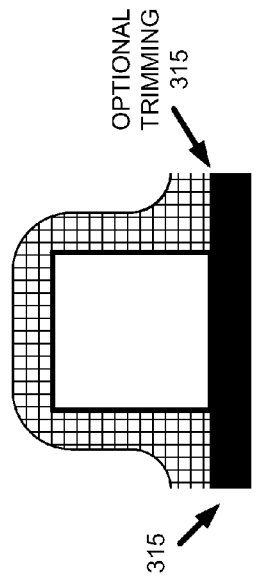
FIG. 4A
FIG. 4B
FIG. 4C

PLURALITY OF PARTS 501

MASK/ADHESIVE 502

MASK 502

SACRIFICIAL MATERIAL 505

MASK 502

MASK REMOVAL 515

TARGET SURFACE COATING 520

PLURALITY OF PARTS w/ COATING 595

METHOD FOR SELECTIVELY TREATING SURFACES

TECHNICAL FIELD

This disclosure relates generally to manufacturing, and in particular but not exclusively, relates to manufacturing of optical components.

BACKGROUND INFORMATION

Manufacturing parts and components often requires treating selected or target surfaces areas with selected substances while leaving non-target surface areas unaffected. The selected substances may include a gas or a liquid. A possible target surface area may be one of six faces of a cubic structure (i.e. a three-dimensional rectangle). FIG. 1A shows a cubic structure 100 with a treated surface area 105 on one of the six faces of cubic structure 100, while five faces of cubic structure 100 are not treated. Of course, cubic structure 100 could have more than one of its faces treated. FIG. 1B shows a sphere 125 that includes a treated surface area 130. FIG. 1C illustrates a prism-like structure 150 that includes treated surface area 155 covering two of the five faces of prism-like structure 150. FIGS. 1A-1C are only examples of parts or objects with surface areas or surfaces that may be desirable to treat.

In some cases, it is desirable to etch the target surface area and in other cases, it may be desirable to apply a coating to the target surface area. Often times, the target surface area must be treated within very tight tolerances. One conventional method of treating a target surface area includes placing the part or object to be treated in a cradle or holder that covers the non-target surface area but leaves the target surface area exposed for treatment. However, this method has the potential drawback of unacceptable tolerance differences between the part to be treated and the cradle. Additionally, separating the object or part from the cradle after the treatment may cause an uneven coating edge or otherwise be problematic. Consequently, a method of selectively treating a target surface area of a part without the drawbacks of the conventional methods is desirable.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

FIGS. 4A-4F are side views illustrating different stages in an example method of etching a target surface area of an object, in accordance with an embodiment of the disclosure.

DETAILED DESCRIPTION

Embodiments of a method for selectively treating a surface area are described herein. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1C:
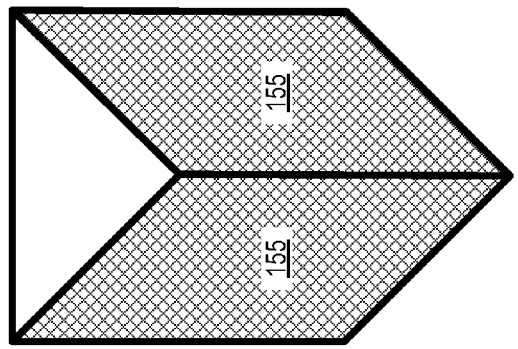
FIGS. 1A-1C illustrate example objects with target and non-target surface areas, in accordance with an embodiment of the disclosure.
Figure 1B:
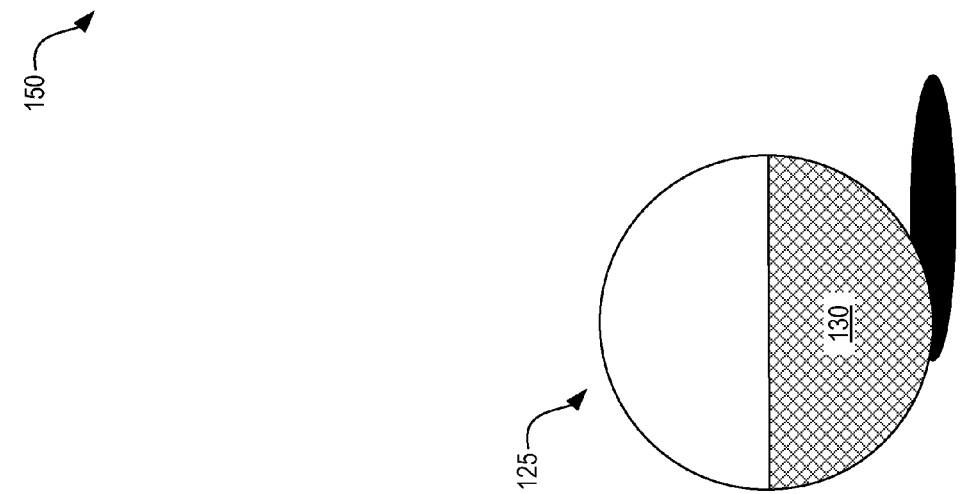
Figure 1A:
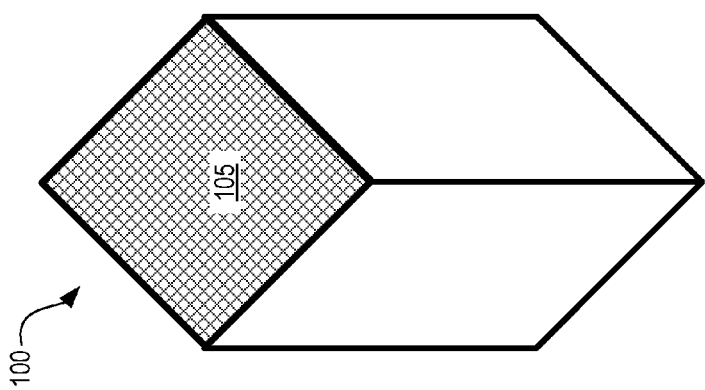
Figure 2:
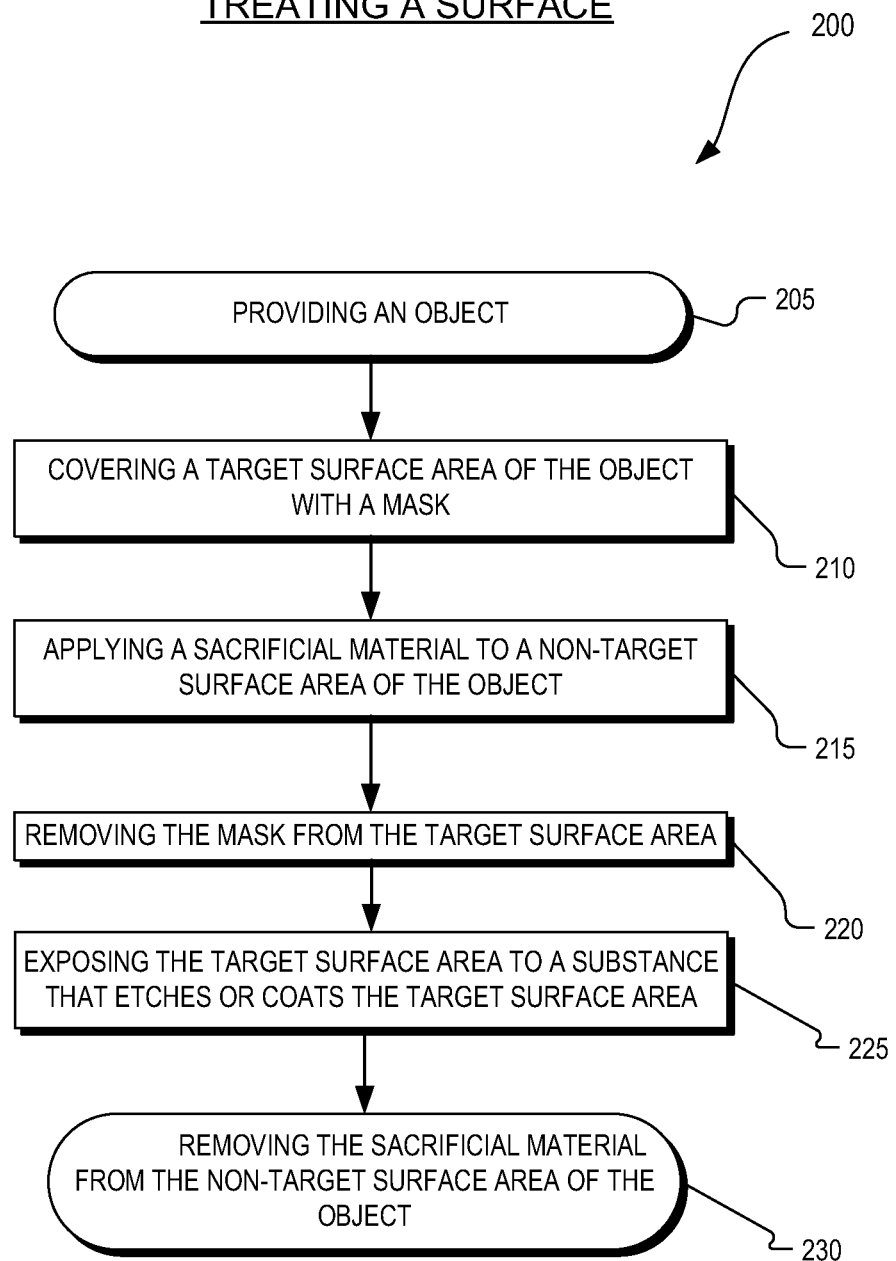
FIG. 2 is a flowchart illustrating an example process of selectively treating a surface, in accordance with an embodiment of the disclosure.

FIG. 2 is a flowchart illustrating a process 200 of selectively treating a surface, in accordance with an embodiment of the disclosure. The order in which some or all of the process blocks appear in process 200 should not be deemed limiting. Rather, one of ordinary skill in the art having the benefit of the present disclosure will understand that some of the process blocks may be executed in a different order not illustrated and that there may be additional process blocks in process 200.

In process block 205, an object is provided. In one example, the object is an optical part made of glass or acrylic plastic. In one example, the object is an eyepiece for a head mounted display ("HMD"). The eyepiece may be removable. An HMD is a display device worn on or about the head. HMDs usually incorporate some sort of near-to-eye optical system to emit a light image within a few centimeters of the human eye.

Figure 3A:
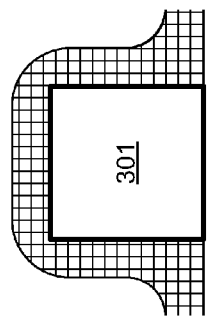
FIGS. 3A-3F are side views illustrating different stages in an example method of coating a target surface area of an object, in accordance with an embodiment of the disclosure.

In process block 210, a target surface area of the object is covered with a mask. A target surface area is a surface area intended to be treated with a selected material. FIGS. 3A and 4A illustrate one face of an object/part 301 being covered by mask 302. Object/part 301 may be a cubic structure (i.e. a three-dimensional rectangle) with six faces, similar to cubic structure 100. In the illustrated examples, one face of object/part 301 is the target surface area 303, although the target surface area could include more than one face of object/part 301. It is appreciated that process 200 could be performed on parts with different sizes and shapes, including, but not limited to, sphere 125 and prism-like structure 150.

Mask 302 may be an adhesive film or a tape. An adhesive film may be laminated on the target surface area of object/part 301. In one embodiment, mask 302 is an ultra-violet ("UV") release tape that can be used to facilitate separation later in process 200. In one embodiment, a double-sided adhesive is laminated onto a rigid substrate to keep a film (acting as mask 302) flat while applying the film to a part, such as object/part 301. In one embodiment, the rigid substrate is metal. In one embodiment, the rigid substrate is glass. Other materials may be used for the rigid substrate.

Figure 3B:
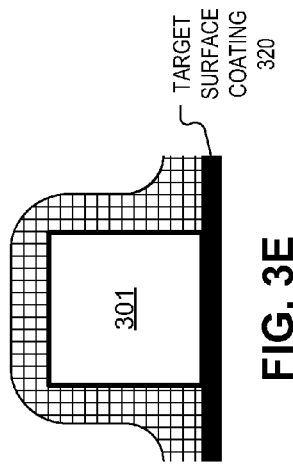

In process block 215, a sacrificial material 305 is applied to a non-target surface area 313 of object/part 301. Non-target surface area 313 may be referred to as a "passive surface." In FIGS. 3B and 4B, non-target surface area 313 includes the five faces of object/part 301 that are not covered by mask 302.

A water-soluble or solvent-soluble coating may be used for sacrificial material 305. Examples of sacrificial material 305 may include photoresists, polyimide, gelatin, wax, acrylate polymers, polyurethanes, polyvinyl butyral, titanium dioxide, vinyl acetate polymers, silicones, and polyalkylene carbonates. It is appreciated that other materials may be used as sacrificial material 305. Methods for applying sacrificial material 305 may include dip-coating, spray-coating, spin-coating, or other methods known to those skilled in the art.

In some embodiments, sacrificial material 305 may be optionally cured. In one embodiment, sacrificial material 305 is temperature cured. In one embodiment, sacrificial material 305 is cured by exposing sacrificial material 305 to UV light.

Figure 3C:
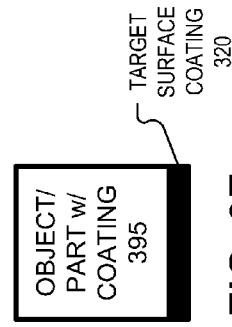

In FIGS. 3C and 4C, an optional trimming step is shown. Mask 302 and/or portions of sacrificial material 305 may be trimmed to better facilitate process 200. In one example, mask 302 and sacrificial material 305 are trimmed within millimeters (e.g. 2-5 mm) of object/part 301.

Figure 3D:
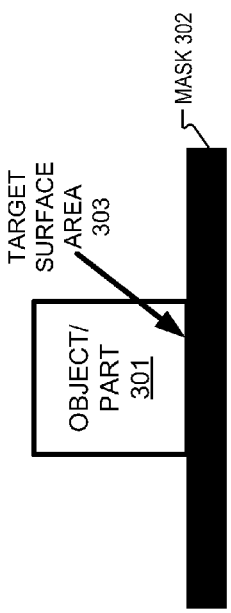

In process block 220, the mask is removed from the target surface area. FIGS. 3D and 4D shows that mask 302 has been removed from target surface area 303, leaving object/part 301 with non-target surface area 313 covered with sacrificial material 305 and target surface area 303 bare or essentially bare. If mask 302 is an adhesive film, it may be removed mechanically, manually, chemically, or otherwise. In one embodiment, mask 302 is a UV release tape and it is exposed to UV light, which reduces tackiness properties of the UV release tape. One potential advantage of using the UV release tape is a reduction of a risk of removing part of sacrificial material 305 while removing mask 302. If sacrificial material 305 is partially removed from non-target surface area 313, a target surface coating (process block 225) may adhere to a non-target surface area 313, which would be undesirable.

In process block 225, the target surface area is exposed to a substance that etches or coats the target surface area. Methods for applying the target coating or etchant include spin-coating, dip-coating, spray coating, dispensing, chemical vapor deposition ("CVD"), and/or physical vapor deposition ("PVD"). Other methods of applying an etchant or coating are possible.

Examples of target coatings or treatments include color coatings, filter coatings, diffusion barrier coatings, photochromic coatings, anti-reflection ("AR") coatings, abrasion-resistant coatings, polarizing coatings, hydrophobic treatment, oleophobic treatments, and hydrophilic treatments. Other coatings or treatments are possible. It is also possible to apply more than one coating or treatment. For example, in the manufacturing of an optical part, a first optical layer may be coated over target surface area 303. Subsequently, a second optical layer may be coated over the first layer. Then, when the sacrificial material is removed (process block 230), target surface area 303 may be left with a first optical layer adhered to target surface area 303 and a second optical layer adhered to the first optical layer in the same or approximately the same dimensions as target surface area 303.

Figure 3E:
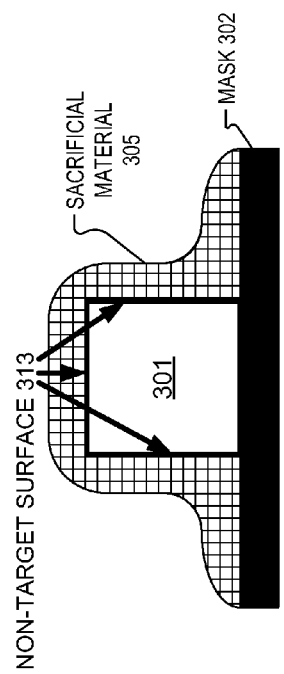

FIG. 3E shows target surface coating 320 adhering to target surface area 303 of object/part 301. In the illustrated embodiment, target surface coating 320 also extends onto sacrificial material 305. However, sacrificial material 305 prevents target surface coating 320 from adhering to non-target surface area 313.

In some embodiments, target surface coating 320 is cured. In one embodiment, target surface coating 320 is temperature cured. In one embodiment, target surface coating 320 is cured by exposing sacrificial material 305 to UV light.

FIG. 4E shows that etching 421 has occurred on target surface area 303. However, etching 421 has not occurred on non-target surface area 313 because sacrificial material 305 prevented the etchant that etched etching 421 from acting on non-target surface area 313.

In process block 230, the sacrificial material is removed from the non-target surface area of the object or part. The sacrificial material may be removed in using a variety of techniques including peeling, dissolution in water, or etching in acid or alkaline solution. The sacrificial material may be removed by dissolution in an organic solvent such as acetone, methyl pyrrolidone, isopropanol, ethanol, methanol, or anisole. Other organic solvents may also be used. The sacrificial may be removed using plasma etching, gas-phase etching, thermal decomposition, or photo-activated decomposition. Several combinations of sacrificial materials and removal techniques are possible.

Figure 3F:
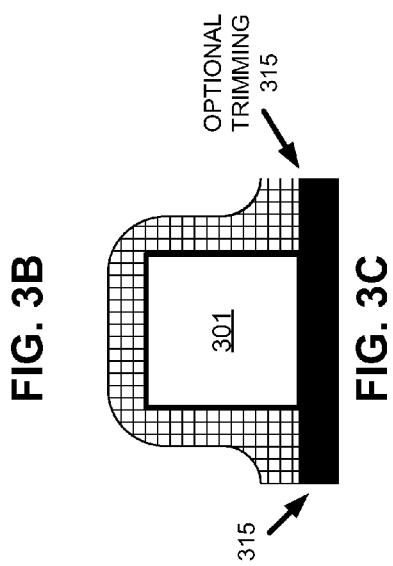

FIG. 3F shows sacrificial material 305 removed from object/part 301, leaving object/part with coating 395. As illustrated, target surface coating 320 is left coating target surface area 303 and not coating non-target surface area 313. As mentioned previously, one conventional method of applying a target surface coating to an object or part involves a cradle or holder to protect a non-target surface area and expose the target surface area. One potential advantage of using process 200 in connection with FIGS. 3A-3F is that the edge of the target surface coating relative to the target surface area may have a tighter tolerance. Additionally, the edge of the target surface coating may be neater compared to a potentially uneven edge of a target surface coating that must be removed from a cradle or holder.

One method of selectively treating (e.g. coating or etching) a surface includes simply applying a mask (e.g. patterned photoresist) to a non-target surface area and then exposing the target surface area (which is not protected by the mask) to a coating or etchant. Process 200 differs in that the mask or masking layer is applied to the target surface area (the area to be coated or etched) rather than the non-target surface area, and then a sacrificial material is applied to the non-target area of the object while the mask is still applied to the target surface area. If it is easier to mask a target surface area of an object rather than mask a non-target surface area, process 200 may be advantageous. Process 200 may be especially advantageous when selectively treating a surface area of a three-dimensional part or object because it may be easier to precisely mask one side or face of a three dimensional part or object rather than precisely masking every side or face of a three dimensional object.

FIG. 4F shows sacrificial material 305 removed from object/part 301, leaving object/part with etching 495. As illustrated, etching 421 is on target surface area 303 and not on non-target surface area 313.

Process 200 may be used in a variety of commercial applications. For example, process 200 could be used in manufacturing liquid crystal displays ("LCD"). LCDs, and in particular, touch-screen LCDs require layers of glass and/or optical films to be bonded to one another. In one example, process 200 may be used to apply an adhesive to a piece of glass. Using process 200, the adhesive will be applied to a target surface area (e.g. one side of a piece of glass, but not over the edge), but not onto non-target surface areas. Process 200 may be especially applicable in manufacturing mobile devices that have sensitive tolerances. In one embodiment, process 200 may be used to apply an anti-scratch and/or anti-fingerprint film on a top surface of a touch-screen LCD.

Figure 5A:
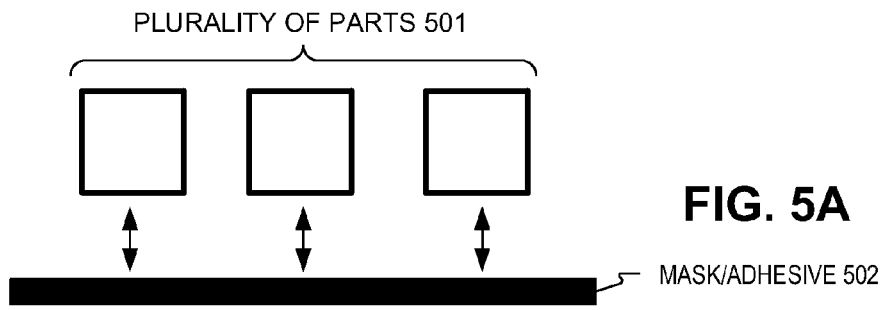
FIGS. 5A-5F are side views illustrating different stages in an example method of coating target surface areas of a plurality of parts, in accordance with an embodiment of the disclosure.
Figure 5B:
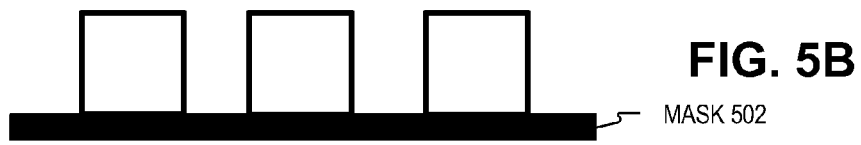
Figure 5C:
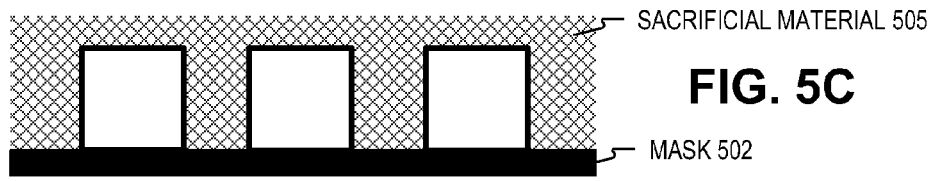

FIGS. 5A-5F are side views illustrating different stages in an example method of coating target surface areas of a plurality of parts, in accordance with an embodiment of the disclosure. FIG. 5A shows a plurality of parts 501 (e.g. cubic structures) being provided and applying a mask 502 to the plurality of parts. FIG. 5B shows mask 502 applied to plurality of parts 501 and covering the target surface area of each of the plurality of parts. Mask 502 may include the examples discussed above, in connection with mask 302. In FIG. 5C, sacrificial material 505 is applied to the non-target surface area of each of the plurality of parts 501. Sacrificial material 505 may include the examples discussed above, in connection with sacrificial material 305.

Figure 5D:
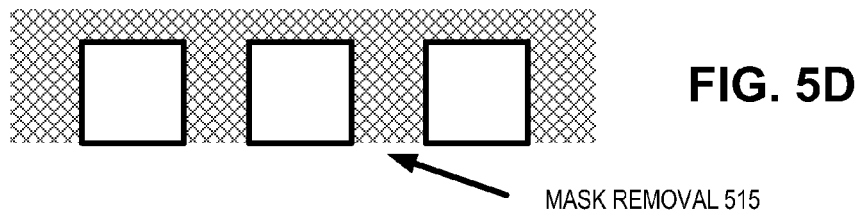
Figure 5E:
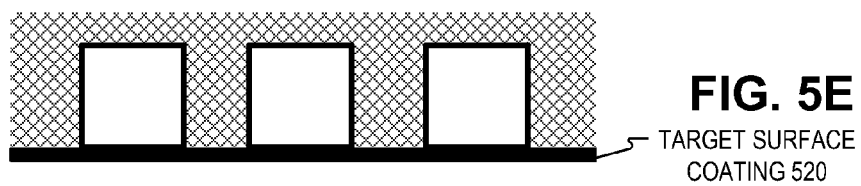
Figure 5F:
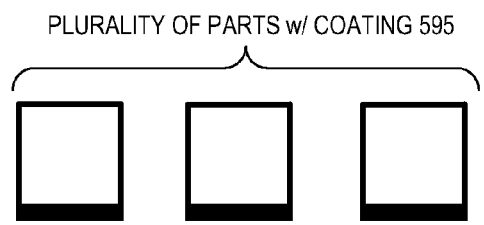

The mask 502 is removed from the target surface area of each of the plurality of parts 501 in a mask removal step 515, in FIG. 5D. In FIG. 5E, the target surface area of each of the plurality of parts 501 is coated with target surface coating 520. FIG. 5F shows a plurality of parts with coating 595. In FIG. 5F, sacrificial material 505 has been removed from the plurality of parts 501, which leaves a plurality of parts with coating 595 that have target surface coating 520 on the target surface area of each of the plurality of parts.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A method of treating a surface comprising:
    providing an object having at least one planar face;
    applying a masking layer to a target surface area of the object, wherein the target surface area includes at least a portion of the planar face, and wherein applying the masking layer to the target surface area is a dry process;
    applying a sacrificial material to a non-target surface area of the object while the masking layer is still applied to the target surface area of the object;
    removing the masking layer from the target surface area;
    exposing the target surface area to a substance that etches the target surface area of the object; and
    removing the sacrificial material from the non-target surface area of the object and leaving the target surface area of the object etched by the substance while the non-target surface area is not etched by the substance, wherein the object includes an optical eyepiece to be coupled to a head mounted display ("HMD") and the masking layer includes an adhesive film for bonding to the target surface area.

2. The method of claim 1 further comprising:
    curing the sacrificial material after applying the sacrificial material to the non-target surface area.

3. The method of claim 2, wherein curing the sacrificial material includes exposing the sacrificial material to ultraviolet ("UV") light.

4. The method of claim 1 further comprising:
    trimming a portion of the sacrificial material from the object.

5. The method of claim 1, wherein the sacrificial material is solvent soluble.

6. The method of claim 1, wherein removing the sacrificial material includes etching the sacrificial material.

7. The method of claim 1, wherein the object is a cubic part having six surfaces and the target surface area is a first surface of the six surfaces.

8. A method comprising:
    providing a plurality of optical parts, wherein each optical part in the plurality of optical parts includes a planar face and includes an optical eyepiece to be coupled to a head mounted display ("HMD");
    applying an adhesive to the planar face of each of the optical parts in the plurality of optical parts, wherein a target surface area of each of the plurality of optical parts is the planar face;
    applying a sacrificial material to a non-target surface area of each of the plurality of optical parts;
    removing the adhesive from the target surface area of each of the plurality of optical parts;
    coating the target surface area of each of the plurality of optical parts; and
    removing the sacrificial material from the non-target surface area of the plurality of optical parts.

9. The method of claim 8, wherein the adhesive includes a double-sided adhesive that is laminated to a rigid substrate.

10. The method of claim 8, wherein the adhesive includes an ultra-violet ("UV") release tape.

11. The method of claim 8, wherein coating the target surface area of each of the plurality of optical parts includes utilizing chemical vapor deposition.

12. The method of claim 8, wherein coating the target surface area of each of the plurality of optical parts includes coating the target surface area with a photochromic coating.

13. A method of treating a surface comprising:
    providing an optical part having at least one planar face, wherein the optical part is for including in a head mounted display ("HMD");
    applying a masking layer to a target surface area of the optical part, wherein the target surface area includes at least a portion of the planar face, and wherein applying the masking layer to the target surface area is a dry process;
    applying a sacrificial material to a non-target surface area of the optical part while the masking layer is still applied to the target surface area of the optical part;
    removing the masking layer from the target surface area;
    exposing the target surface area to a substance that etches or coats the target surface area of the optical part; and
    removing the sacrificial material from the non-target surface area of the optical part and leaving the target surface area of the optical part etched or coated by the substance while the non-target surface area is not etched or coated by the substance.

* * * * *